(12) United States Patent
Yan et al.

(10) Patent No.: US 10,872,929 B2
(45) Date of Patent: Dec. 22, 2020

(54) ELECTROLUMINESCENT DISPLAY AND DISPLAY DEVICE

(71) Applicant: Boe Technology Group Co., Ltd., Beijing (CN)

(72) Inventors: Guang Yan, Beijing (CN); Changyen Wu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/123,312

(22) Filed: Sep. 6, 2018

(65) Prior Publication Data
US 2019/0006432 A1 Jan. 3, 2019

Related U.S. Application Data

(62) Division of application No. 14/913,334, filed as application No. PCT/CN2015/086453 on Aug. 10, 2015, now abandoned.

(30) Foreign Application Priority Data

Apr. 1, 2015 (CN) .......................... 2015 1 0151748

(51) Int. Cl.
*H01L 27/32* (2006.01)
*H01L 51/00* (2006.01)
(Continued)

(52) U.S. Cl.
CPC .......... *H01L 27/3206* (2013.01); *H01L 27/32* (2013.01); *H01L 27/3213* (2013.01);
(Continued)

(58) Field of Classification Search
CPC . H01L 27/3206; H01L 27/32; H01L 27/3213; H01L 51/001; H01L 51/0011; H01L 51/5036; H01L 51/5265
(Continued)

(56) References Cited

U.S. PATENT DOCUMENTS 6,016,033 A 1/2000 Jones et al.
8,716,929 B2 5/2014 Yoo et al.
(Continued)

FOREIGN PATENT DOCUMENTS

CN 102386208 3/2012
CN 102593150 7/2012
(Continued)

OTHER PUBLICATIONS

Search Report for European Patent Application No. 15832674.4 dated Nov. 9, 2018.
(Continued)

*Primary Examiner* — Dzung Tran
(74) *Attorney, Agent, or Firm* — Calfee, Halter & Griswold LLP

(57) ABSTRACT

The present invention discloses an electroluminescent display and a display device, the electroluminescent display comprising a base substrate and a plurality of pixel units arranged in arrays on the base substrate. Each pixel unit is composed of at least four subpixel units, and each pixel unit comprises at least three luminescent material layers. Each luminescent material layer at least covers two adjacent subpixel units, and only one luminescent material layer in each subpixel unit emits light. Since each luminescent material layer at least covers two adjacent subpixel units, when a luminescent material is evaporated and coated by an evaporation coating process, the subpixel units can be made smaller with the size of the mask plate unchanged, which is helpful for improving the resolution of the display.

17 Claims, 4 Drawing Sheets

(51) Int. Cl.
*H01L 51/50* (2006.01)
*H01L 51/52* (2006.01)

(52) U.S. Cl.
CPC ........ *H01L 51/001* (2013.01); *H01L 51/0011* (2013.01); *H01L 51/5036* (2013.01); *H01L 51/5265* (2013.01)

(58) Field of Classification Search
USPC .......................................................... 257/90
See application file for complete search history.

(56) References Cited

U.S. PATENT DOCUMENTS

| | | | |
|---|---|---|---|
| 2004/0115859 | A1 | 6/2004 | Murayama |
| 2005/0007014 | A1 | 1/2005 | Kurata |
| 2007/0024186 | A1 | 2/2007 | Chen |
| 2007/0052351 | A1 | 3/2007 | Chang |
| 2007/0052354 | A1* | 3/2007 | Chang ................... H01L 27/322 313/509 |
| 2007/0075312 | A1* | 4/2007 | Chin ................... H01L 27/3209 257/40 |
| 2007/0096632 | A1 | 5/2007 | Chin |
| 2010/0051973 | A1 | 3/2010 | Kobayashi |
| 2010/0090241 | A1 | 4/2010 | D'Andrade et al. |
| 2011/0121753 | A1 | 5/2011 | Nagayama et al. |
| 2013/0001612 | A1* | 1/2013 | Lee ..................... H01L 27/3211 257/98 |
| 2013/0147689 | A1* | 6/2013 | Liu .......................... G09G 3/30 345/76 |
| 2013/0207085 | A1* | 8/2013 | Im ......................... H01L 51/504 257/40 |
| 2014/0284565 | A1 | 9/2014 | Park et al. |
| 2015/0001480 | A1* | 1/2015 | Kim .................... H01L 51/0013 257/40 |
| 2016/0163772 | A1 | 6/2016 | Wu |

FOREIGN PATENT DOCUMENTS

| | | |
|---|---|---|
| CN | 103779387 | 5/2014 |
| CN | 103779387 A | 5/2014 |
| CN | 103824875 | 5/2014 |
| CN | 103854570 | 6/2014 |
| CN | 104617130 | 5/2015 |
| CN | 104617231 | 5/2015 |
| CN | 104733506 | 6/2015 |
| WO | 2009154288 A1 | 12/2009 |

OTHER PUBLICATIONS

Office action from Chinese Application No. 201510151748.6 dated Mar. 20, 2017.
Search Report and Written Opinion for International Application No. PCT/CN2015/086453 dated Dec. 31, 2015.
Final Office Action for U.S. Appl. No. 14/913,334 dated Jun. 8, 2018.
Amendment in Response to Office Action dated Feb. 15, 2018 in U.S. Appl. No. 14/913,334 dated May 2, 2018.
Office Action for U.S. Appl. No. 14/913,334 dated Feb. 15, 2018.
Request for Continued Examination for U.S. Appl. No. 14/913,334 dated Dec. 20, 2017.
Advisory Action for U.S. Appl. No. 14/913,334 dated Dec. 11, 2017.
Office Action for U.S. Appl. No. 14/913,334 dated Sep. 27, 2017.
Amendment in Response to Office Action dated Apr. 6, 2017 for U.S. Appl. No. 14/913,334 dated Jul. 6, 2017.
Office Action for U.S. Appl. No. 14/913,334 dated Apr. 6, 2017.
Response to Non-Complaint Amendment dated Feb. 21, 2017 for U.S. Appl. No. 14/913,334 dated Mar. 2, 2017.
Notice of Non-Compliant Amendment for U.S. Appl. No. 14/913,334 dated Feb. 21, 2017.
Response to Restriction Requirement dated Dec. 14, 2016 for U.S. Appl. No. 14/913,334 dated Feb. 7, 2018.
Restriction Requirement for U.S. Appl. No. 14/913,334 dated Dec. 14, 2016.

* cited by examiner

ELECTROLUMINESCENT DISPLAY AND DISPLAY DEVICE

RELATED APPLICATIONS

The present application claims priority to U.S. patent application Ser. No. 14/913,334, filed Feb. 19, 2016 and published as U.S. Publication No. 2017/0040388, which is a U.S. national phase entry of PCT/CN2015/086453, with an international filling date of Aug. 10, 2015, which claims the benefit to Chinese Patent Application No. 201510151748.6, filed on Apr. 1, 2015, the entire disclosure of the to foregoing are incorporated herein by reference in their entirety.

FIELD

The present invention relates to the field of display technologies, and in particular to an electroluminescent display and a display device.

BACKGROUND

At present, organic electroluminescent displays (also indicated as OLED hereinafter) have gradually become the mainstream for the display field because of their excellent performances such as low power consumption, high color saturation, wide view angle, thin thickness and the flexibility.

The full color display of an OLED display is generally achieved by means of independent light emission by red (R), green (G) and blue (B) subpixels or combined light emission by a white OLED and a color filter. In this case, independent light emission by red (R), green (G) and blue (B) subpixels is the most frequently adopted color mode for an OLED display currently, which achieves independent light emission by means of organic luminescent materials in the RGB subpixels.

As shown in FIG. 1, a basic structure for an OLED display which emits light independently by means of organic luminescent materials in the RGB subpixels comprises a base substrate 001, as well as an anode 002, a light-emitting layer 003 and a cathode 004 arranged on the base substrate 001 sequentially, wherein the light-emitting layer 003 consists of a red organic luminescent material, a green organic luminescent material and a blue organic luminescent material disposed in parallel and circular arrangement. The light-emitting principle is that when a voltage is applied to the anode 002 and the cathode 004 respectively to form a current, electrons in the cathode 004 and holes in the anode 002 will be combined to form excitons in the light-emitting layer 003, which excite the organic luminescent materials in the light-emitting layer 003 to emit light. When the RGB subpixels in the OLED display are arranged in a juxtaposed manner, the technique of fine metal mask (FMM) will be mainly adopted during the preparation of the light-emitting layer 003. That is to say, when an organic luminescent material is evaporated and coated in the RGB, shielding the other two subpixels by the shielding effect of a shielding area in a mask plate, and then moving the mask plate or the base substrate by a fine alignment system to evaporate and coat the other two organic luminescent materials. However, the resolution of an OLED made in this manner is subject to the size of the mask plate for evaporation and coating.

Therefore, how to further improve the resolution of the OLED by using a new structure design without varying the size of the mask plate is an urgent technical problem to be solved by those skilled in the art.

SUMMARY

In this regard, the embodiments of the present invention provide an electroluminescent display and a display device, whereby the resolution of the display can be improved.

Accordingly, an embodiment of the present invention provides an electroluminescent display comprising a base substrate and a plurality of pixel units arranged in arrays on the base substrate. Each of the pixel units is composed of at least four subpixel units, and each of the pixel units comprises at least three luminescent material layers. Each of the luminescent material layers at least covers two adjacent subpixel units, and only one of the luminescent material layers in each of the subpixel units emits light.

According to a possible implementation, in the electroluminescent display provided by an embodiment of the present invention, each of the luminescent material layers in a same one of the pixel units is made of a different material, and each of the subpixel units in a same one of the pixel units emits light of a different color.

According to a possible implementation, in the electroluminescent display provided by an embodiment of the present invention, each of the subpixel units comprises a first electrode, at least one luminescent material layer, and a second electrode arranged on the base substrate sequentially. The first electrode specifically comprises a reflective layer arranged on the base substrate and a transparent electrode located over the reflective layer. According to a possible implementation, in the electroluminescent display provided by an embodiment of the present invention, in a same one of the pixel units, at least one of the subpixel units has a micro cavity length different from that of another one of the subpixel units, the micro cavity length being a length from a side of the reflective layer away from the base substrate to a side of the second electrode away from the base substrate.

According to a possible implementation, in the electroluminescent display provided by an embodiment of the present invention, in a same one of the pixel units, each of the subpixel units has a different micro cavity length.

According to a possible implementation, in the electroluminescent display provided by an embodiment of the present invention, in a same one of the pixel units, the transparent electrode corresponding to each of the subpixel units has a different thickness.

According to a possible implementation, in the electroluminescent display provided by an embodiment of the present invention, each of the pixel units is composed of four subpixel units. Each of the pixel units specifically comprises a first luminescent material layer covering a second subpixel unit and a third subpixel unit, a second luminescent material layer covering a first subpixel unit and a second subpixel unit, and a third luminescent material layer covering a third subpixel unit and a fourth subpixel unit. In the second subpixel unit and the third subpixel unit, only the first luminescent material layer emits light.

According to a possible implementation, in the electroluminescent display provided by an embodiment of the present invention, both the second luminescent material layer and the third luminescent material layer are located above or below the first luminescent material layer. A carrier or exciton blocking layer is arranged therebetween in a portion where the second luminescent material layer and the third luminescent material layer overlap the first luminescent material layer.

According to a possible implementation, in the electroluminescent display provided by an embodiment of the present invention, each of the pixel units further comprises a hole transport layer arranged between the first electrode and the luminescent material layer, and/or an electron transport layer arranged between the second electrode and the luminescent material layer.

An embodiment of the present invention further provides a display device comprising the electroluminescent display provided by an embodiment of the present invention.

The embodiments of the present invention provide an electroluminescent display and a display device comprising the same. The electroluminescent display comprises a base substrate and a plurality of pixel units arranged in arrays on the base substrate. Each pixel unit is composed of at least four subpixel units, and each pixel unit comprises at least three luminescent material layers. Each luminescent material layer at least covers two adjacent subpixel units, and only one luminescent material layer in each subpixel unit emits light. Since each luminescent material layer at least covers two adjacent subpixel units, when a luminescent material is evaporated and coated by an evaporation coating process, the subpixel units can be made smaller with the size of the mask plate unchanged, which is helpful for improving the resolution of the display.

DETAILED DESCRIPTION OF EMBODIMENTS

Specific embodiments of the electroluminescent display and the display device provided by the embodiments of the present invention will be explained in details with reference to the drawings.

In the following description and drawings, the thickness and shape of each layer do not reflect the real scale of the electroluminescent display, but only for the purpose of schematically illustrating contents of the invention.

Figure 1:
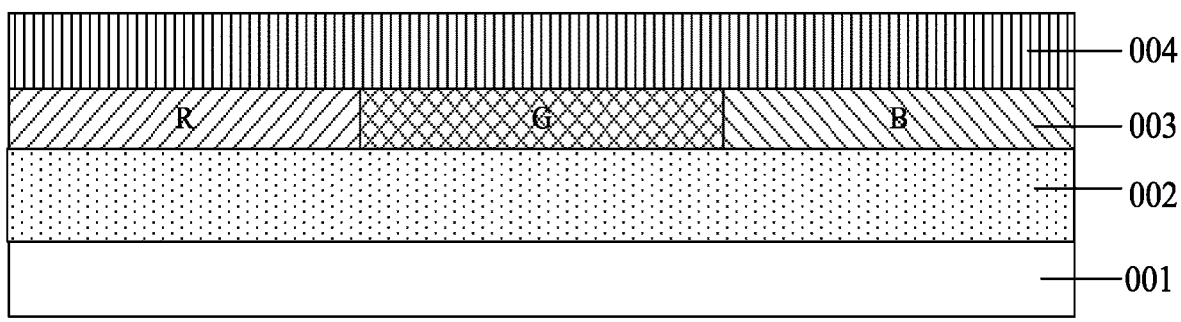
FIG. 1 is a schematic structural view of an electroluminescent display in the prior art.
Figure 2A:
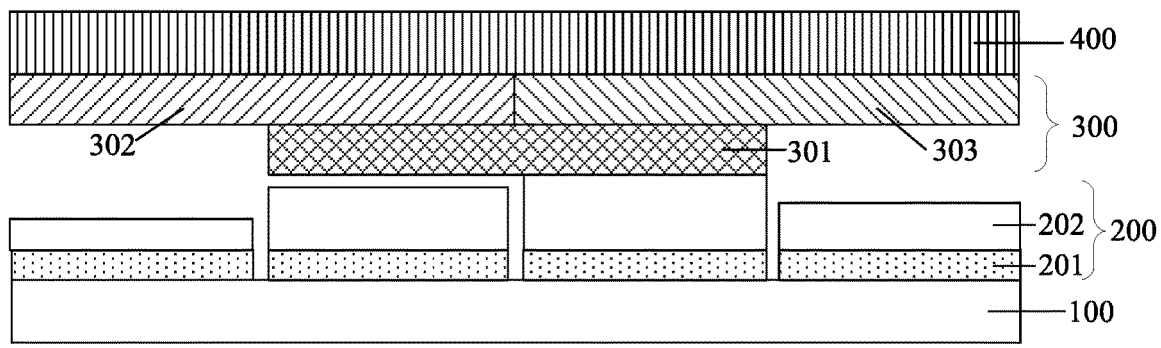
FIGS. 2a to 2f are respectively schematic structural views of an electroluminescent display provided by embodiments of the present invention.
Figure 2B:
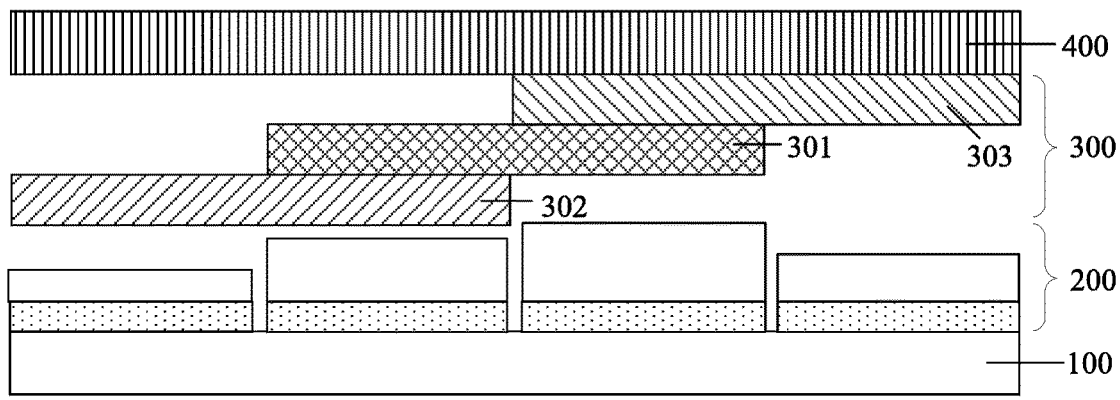
Figure 2C:
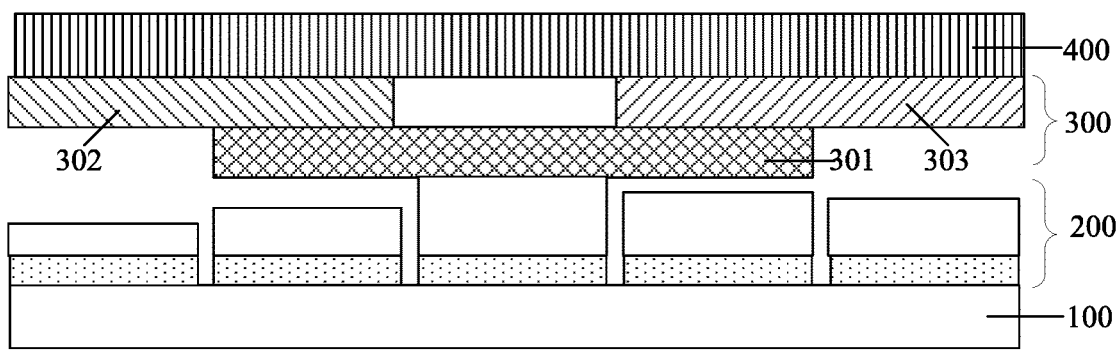

An embodiment of the present invention provides an electroluminescent display as shown in FIGS. 2a-2c, comprising a base substrate 100 and a plurality of pixel units arranged in arrays on the base substrate 100. Each of the pixel units is composed of at least four subpixel units, and each of the pixel units comprises at least three luminescent material layers 300. Each of the luminescent material layers 300 at least covers two adjacent subpixel units, and only one of the luminescent material layers 300 in each of the subpixel units emits light.

In the electroluminescent display provided by an embodiment of the present invention, since each of the luminescent material layers at least covers two adjacent subpixel units, when a luminescent material is evaporated and coated by an evaporation coating process, the subpixel units can be made smaller with the size of the mask plate unchanged, which is helpful for improving the resolution of the display.

Specifically, as an example, as shown in FIGS. 2a and 2b, each pixel unit is composed of four subpixel units, and each pixel unit comprises three luminescent material layers, namely a first luminescent material layer 301, a second luminescent material layer 302 and a third luminescent material layer 303, each luminescent material layer covering two adjacent subpixel units. FIG. 2a and FIG. 2b differ from each other in the arrangement manner for the three luminescent material layers. As shown in FIG. 2c, each pixel unit is composed of five subpixel units, and each pixel unit comprises three luminescent material layers, namely a first luminescent material layer 301, a second luminescent material layer 302 and a third luminescent material layer 303. The first luminescent material layer 301 covers three adjacent subpixel units in the middle, and the second luminescent material layer 302 and the third luminescent material layer 303 cover the two left-most adjacent subpixel units or the two right-most adjacent subpixel units respectively. Here, three schematic structural views of the above electroluminescent display are listed for simplicity. It should be noted that the electroluminescent display provided by an embodiment of the present invention can further be of other structures as long as it satisfies the above conditions, and is not limited to the structure of the electroluminescent display involved in the drawings of the present invention.

According to a specific implementation, in the electroluminescent display provided by an embodiment of the present invention, in order to improve the color gamut of the display, each luminescent material layer in a same pixel unit can be made of a different material. Since the materials themselves have different properties and they can play a decisive role in the color of light emitted by each subpixel unit in combination with the setting for the micro cavity length, light emitted by each subpixel unit in a same pixel unit can have a different color. Specifically, as an example, as shown in FIGS. 2a and 2b, in a same pixel unit, the material for the first luminescent material layer 301 can be a yellow organic luminescent material, and the materials for the second luminescent material layer 302 and the third luminescent material layer 303 can be a dark blue organic luminescent material or a light blue organic luminescent material respectively. In this case, colors of light emitted by each subpixel unit may be respectively dark blue, green, red and light blue from left to right, and a four-pixel type OLED display is realized. As shown in FIG. 2c, in a same pixel, the material for the first luminescent material layer 301 can be a yellow organic luminescent material, and the materials for the second luminescent material layer 302 and the third luminescent material layer 303 can be a dark blue organic luminescent material or a light blue organic luminescent material respectively. In this case, colors of light emitted by each subpixel unit may be respectively dark blue, green, yellow, red and light blue from left to right, and a five-pixel type OLED display is realized. The four-pixel type OLED display and the five-pixel type OLED display realized in the present invention have special advantages such as longer service lifetime, lower power consumption and higher color gamut over a three-pixel type OLED display.

According to a specific implementation, in the electroluminescent display provided by an embodiment of the present invention, as shown in FIGS. 2a-2c, each subpixel unit comprises a first electrode 200, at least one luminescent material layer 300, and a second electrode 400 arranged on the base substrate 100 sequentially. The first electrode 200 specifically comprises a reflective layer 201 arranged on the base substrate 100 and a transparent electrode 202 located over the reflective layer 201. It should be noted that the drawings of the present invention are only for the purpose of schematic illustration, and in the manufacturing process, the luminescent material layer is formed directly on a transparent electrode pattern, so that there is no gap between the transparent electrode and the luminescent material layer. As a specific example shown in FIG. 2a, in the evaporation coating process, the second luminescent material layer 302 is formed directly on the transparent electrode 202, so that after the evaporation coating process, there should be no gap between the second luminescent material layer 302 and the transparent electrode 202.

According to a specific implementation, in the electroluminescent display provided by an embodiment of the present invention, in a same pixel unit, the micro cavity length of at least one subpixel unit can be arranged to be different from that of another subpixel unit. The micro cavity length here is specifically a length from a side of the reflective layer 201 away from the base substrate 100 to a side of the second electrode 400 away from the base substrate 100. With adjustment for the micro cavity length of each subpixel unit, when the same luminescent material layer is used for emitting light and at least two subpixel units covered by this luminescent material layer have different micro cavity lengths, the at least two subpixel units covered thereby will emit light of different colors. The reason for this is that the longer the micro cavity length is, the greater the wavelength of the exit light will be. Specifically, as shown in FIG. 2a, when the first luminescent material layer 301 is used to emit light and the second subpixel unit and the third subpixel unit covered by this first luminescent material layer 301 have different micro cavity lengths, the second subpixel unit and the third subpixel unit will emit light of different colors. It should be noted that the first subpixel unit and the fourth subpixel unit may have the same micro cavity length or different micro cavity lengths, which will not be limited here. When the first subpixel unit and the fourth subpixel unit have the same micro cavity length, the colors of light emitted by the first subpixel unit and the fourth subpixel unit will be determined by the color of the organic luminescent materials themselves.

According to a specific implementation, in the electroluminescent display provided by an embodiment of the present invention, in order to further ensure that each subpixel unit emits light of a different color in a same pixel unit, specifically, in the same pixel unit, the micro cavity length of each subpixel unit can be arranged to be different.

According to a specific implementation, in the electroluminescent display provided by an embodiment of the present invention, as shown in FIG. 2a, since the thickness of the transparent electrode determines the micro cavity length, the micro cavity length can be adjusted by means of the thickness of the transparent electrode, in order that the micro cavity length of each subpixel unit is different in a same pixel unit. In the same pixel unit, the thickness of the transparent electrode 202 corresponding to each subpixel unit can be arranged to be different.

According to a specific implementation, in the electroluminescent display provided by an embodiment of the present invention, as shown in FIG. 2a, each pixel unit is composed of four subpixel units. Each pixel unit specifically comprises a first luminescent material layer 301 covering a second subpixel unit and a third subpixel unit, a second luminescent material layer 302 covering a first subpixel unit and a second subpixel unit, and a third luminescent material layer 303 covering a third subpixel unit and a fourth subpixel unit. In the second subpixel unit and the third subpixel unit, only the first luminescent material layer 301 can emit light.

According to a specific implementation, in the electroluminescent display provided by the embodiments of the present invention, as shown in FIG. 2a, both the second luminescent material layer 302 and the third luminescent material layer 303 can be located above or below the first luminescent material layer 301. It should be noted that the positional relationship of the second luminescent material layer 302 and the third luminescent material layer 303 relative to the first luminescent material layer 301 can also be otherwise. As shown in FIG. 2b, the second luminescent material layer 302, the first luminescent material layer 301 and the third luminescent material layer 303 superpose each other. There can be many different ways for arranging each luminescent material layer, which can be selected upon a specific situation, so no limitation will be made here.

Figure 2D:
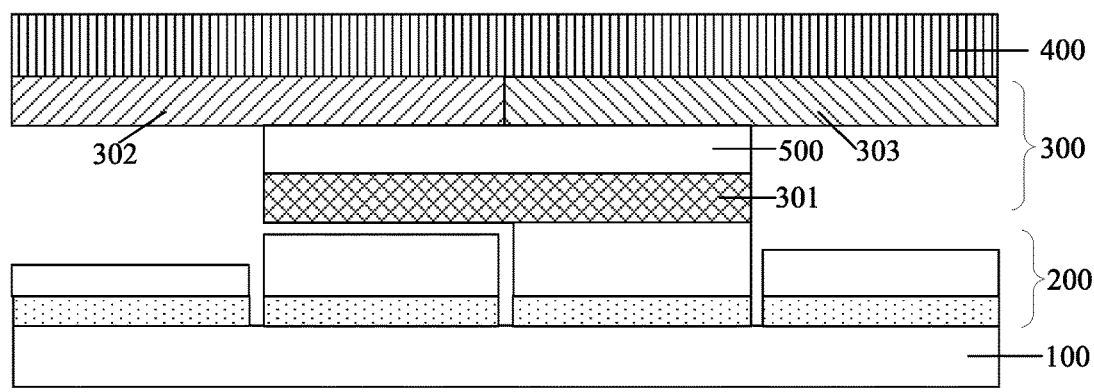
Figure 2E:
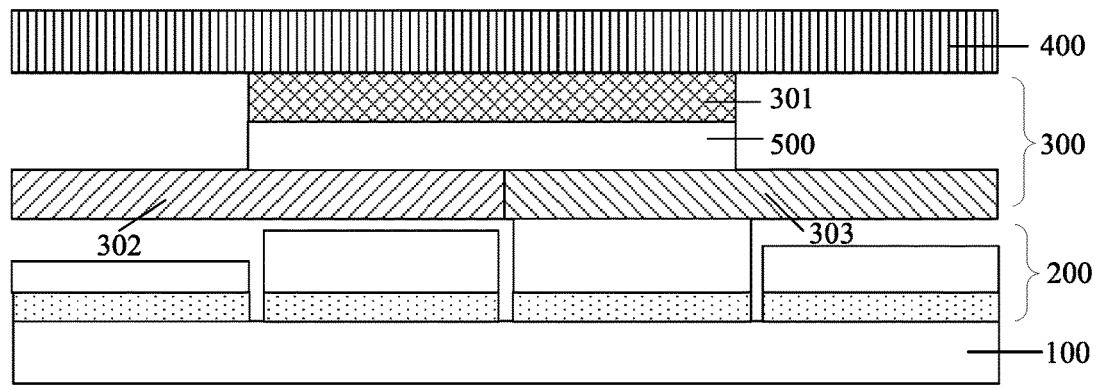

Specifically, as shown in FIG. 2d, a carrier or exciton blocking layer 500 is arranged between the first luminescent material layer 301 and the second luminescent material layer 302 as well as between the first luminescent material layer 301 and the third luminescent material layer 303, such that holes can be prevented from transferring to the second luminescent material layer 302 and the third luminescent material layer 303, while electrons can pass through the carrier or exciton blocking layer 500 and transfer to the first luminescent material layer 301. As a result, the electrons and the holes staying in the first luminescent material layer 301 form excitons, which excite the first luminescent material layer 301 to emit light. It should be noted that the first luminescent material layer 301 in FIG. 2e is arranged below the second luminescent material layer 302 and the third luminescent material layer 303. In a similar way, as shown in FIG. 2e, the first luminescent material layer 301 can also be arranged above the second luminescent material layer 302 and the third luminescent material layer 303 which belong to a same layer. In this case, the exciton blocking layer prevents the electrons from transferring to the second luminescent material layer 302 and the third luminescent material layer 303, while the holes can pass through the carrier or exciton blocking layer 500 and transfer to the first luminescent material layer 301. As a result, the holes and the electrons staying in the first luminescent material layer 301 form excitons, which excite the first luminescent material layer 301 to emit light. These two ways for arrangement are both applicable, and no limitation will be made here.

Specifically, as shown in FIGS. 2d and 2e, when the material for the first luminescent material layer 301 is a yellow organic luminescent material, in combination with the setting for the micro cavity length, the colors of light emitted by the second subpixel unit and the third subpixel unit can be green and red respectively. It should be noted, when the materials for the second luminescent material layer 302 and the third luminescent material layer 303 are a dark blue organic luminescent material or a light blue organic luminescent material respectively, this may cause each pixel unit to emit light of four colors, namely dark blue, green, red and light blue, thereby realizing a four-pixel type OLED display. When the materials for the second luminescent material layer 302 and the third luminescent material layer 303 are a blue organic luminescent material or green organic luminescent material respectively, this may cause each pixel unit to emit light of three colors, namely blue, green and red, thereby realizing a three-pixel type OLED display.

Figure 2F:
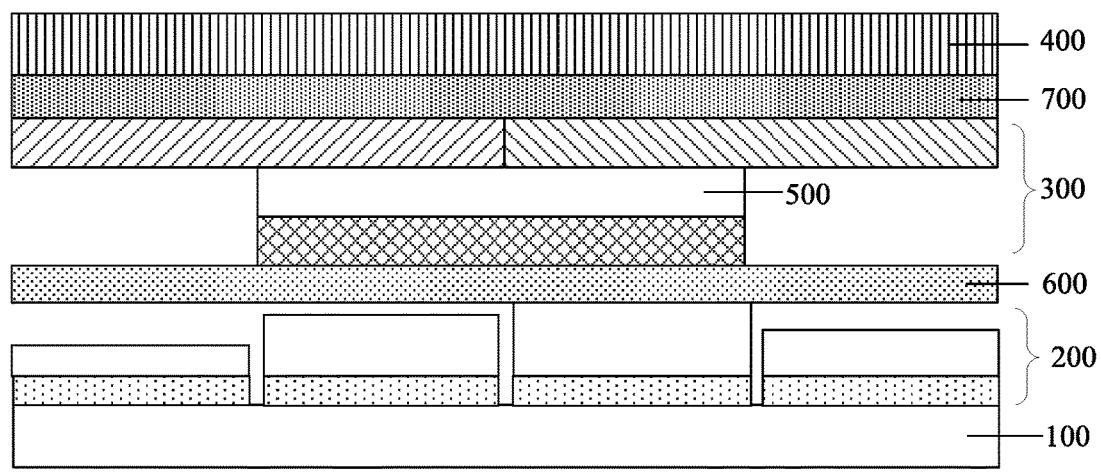

According to a specific implementation, in the electroluminescent display provided by an embodiment of the present invention, as shown in FIG. 2f, in order to improve the luminous efficiency of the display effectively, each pixel unit further comprises a hole transport layer 600 arranged between the first electrode 200 and the luminescent material layer 300, and/or an electron transport layer 700 arranged between the second electrode 400 and the luminescent material layer 300.

Figure 3A:
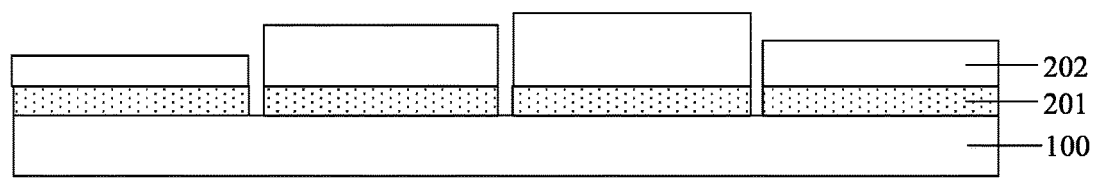
FIGS. 3a to 3f are respectively schematic structural views of an electroluminescent display as shown in FIG. 2g after executing each step of a method for manufacturing the same.

A method for manufacturing the electroluminescent display provided by an embodiment of the present invention will be explained in details as follows in a specific example, which specifically comprises the following steps:

1. Forming a reflective layer and a transparent electrode on a base substrate sequentially Specifically, as shown in FIG. 3a, the reflective layer 201 and the transparent electrode 202 are formed sequentially on the base substrate 100 by a patterning process. In a same pixel unit, the transparent electrode 202 corresponding to each of the four subpixel units has a different thickness.

Figure 3B:
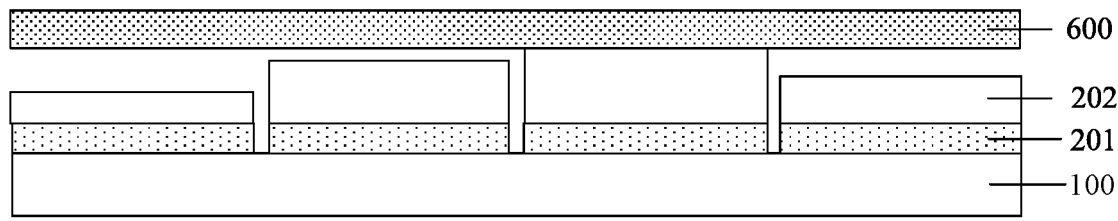

2. Forming a hole transport layer on the base substrate on which the transparent electrode has been formed Specifically, as shown in FIG. 3b, a hole transport layer 600 is formed on the base substrate 100 by a pattering process on which the transparent electrode 202 has been formed.

Figure 3C:
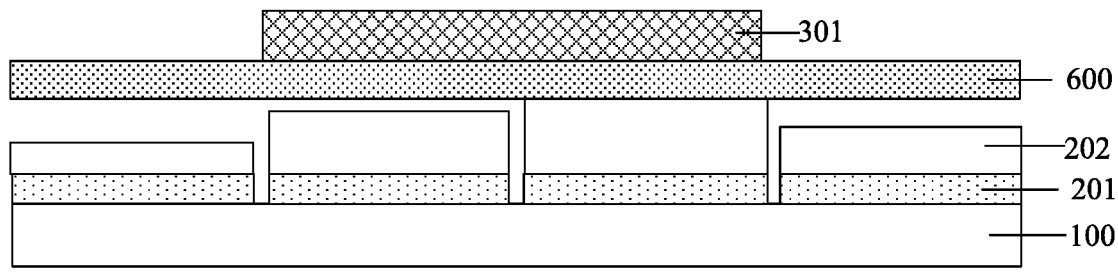

3. Forming a first luminescent material layer on the formed hole transport layer Specifically, as shown in FIG. 3c, the first luminescent material layer 301 is formed on the formed hole transport layer 600 by a patterning process. The first luminescent material layer covers the second subpixel unit and the third subpixel unit.

4. Forming an exciton blocking layer on the first luminescent material layer

Figure 3D:
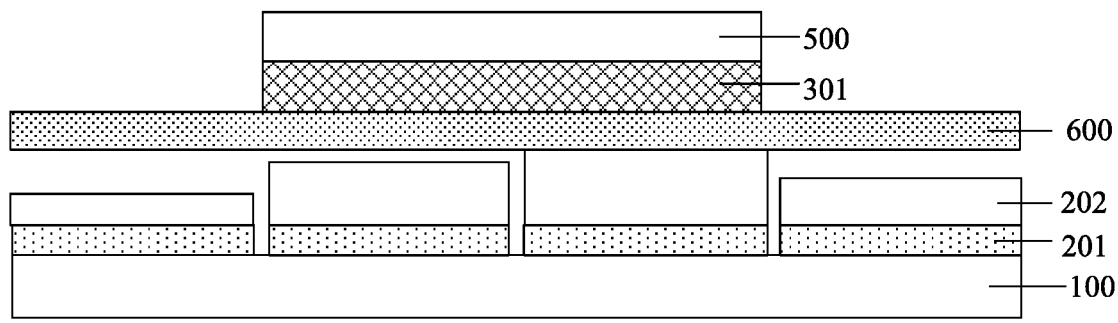

Specifically, as shown in FIG. 3d, the exciton blocking layer 500 is formed on the first luminescent material layer 301 by a patterning process.

A pattern of the exciton blocking layer 500 is the same as that of the first luminescent material layer 301.

Figure 3E:
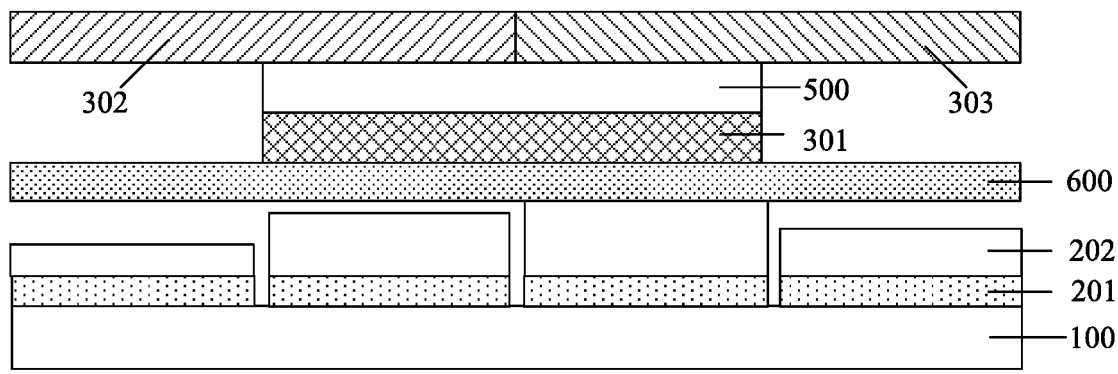

5. Forming a second luminescent material layer and a third luminescent material layer on the exciton blocking layer Specifically, as shown in FIG. 3e, the second luminescent material layer 302 and the third luminescent material layer 303 are formed on the exciton blocking layer 500 by an evaporation coating process. The second luminescent material layer 302 covers the first subpixel unit and the second subpixel unit, and the third luminescent material layer 303 covers the third subpixel unit and the fourth subpixel unit.

Figure 3F:
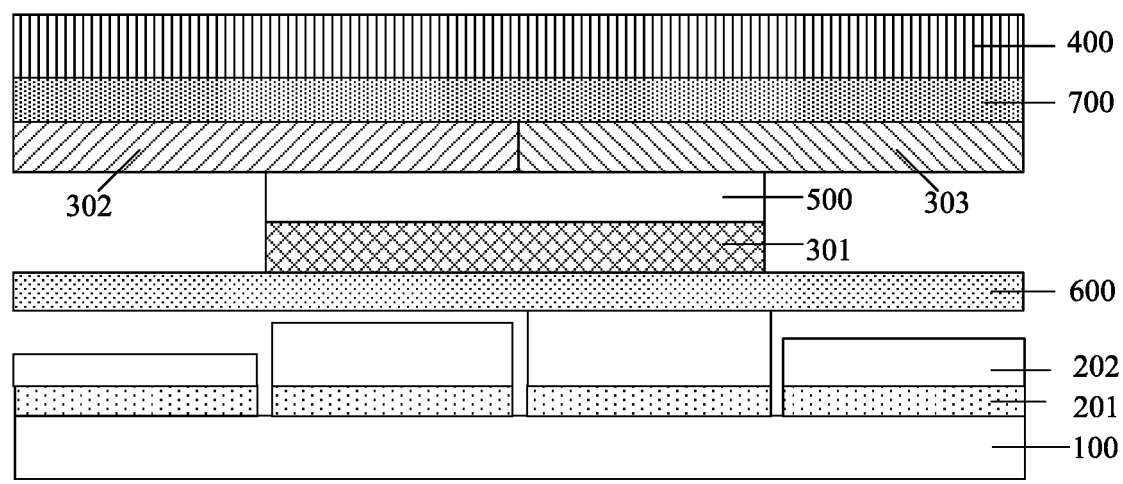

6. Forming an electron transport layer and a cathode sequentially on the second luminescent material layer and the third luminescent material layer Specifically, as shown in FIG. 3f, the electron transport layer 700 and the cathode 400 are formed sequentially on the second luminescent material layer 302 and the third luminescent material layer 303 by a patterning process.

So far, the electroluminescent display provided by the embodiments of the present invention is manufactured through the above steps 1-6 provided in the specific example.

Based on the same inventive concept, an embodiment of the present invention further provides a display device comprising the electroluminescent display provided by an embodiment of the present invention. The display device can be any product or component having a display function, such as a handset, a tablet computer, a television, a display, a notebook computer, a digital photo frame, a navigator and the like. Other essential components necessary for the display device are those which are considered as necessary by those having ordinary skills in the art, which will not be described here for simplicity and should not be taken as a limitation to the present invention. As for the implementation of the display device, the embodiments of the electroluminescent display can be referred to, and the repeated portions will not be described again for simplicity.

The embodiments of the present invention provide an electroluminescent display and a display device comprising the same. The electroluminescent display comprises a base substrate and a plurality of pixel units arranged in arrays on the base substrate, each pixel unit being composed of at least four subpixel units and each pixel unit comprising at least three luminescent material layers. Each luminescent material layer at least covers two adjacent subpixel units, and only one luminescent material layer in each subpixel unit emits light. Since each luminescent material layer at least covers two adjacent subpixel units, when a luminescent material is evaporated and coated by an evaporation coating process, the subpixel units can be made smaller with the size of the mask plate unchanged, which is helpful for improving the resolution of the display.

Obviously, those skilled in the art can make various modifications and transformations to the present invention without deviating from the spirit and scope of the present invention. Accordingly, if these modifications and transformations to the present invention fall within the scopes of the claims of the present invention and the equivalent technologies, the present invention is intended to cover these modifications and transformations.

The invention claimed is:

1. An electroluminescent display comprising a base substrate and a plurality of pixel units arranged in arrays on the base substrate, each of the pixel units being composed of at least four subpixel units, and each of the pixel units comprising at least three luminescent material layers, wherein each of the luminescent material layers at least covers two adjacent subpixel units, wherein the at least three luminescent material layers comprises a first luminescent material layer, a second luminescent material layer and a third luminescent material layer, the second luminescent material layer and the third luminescent material layer are arranged in a same layer, the first luminescent material layer is arranged in a different layer from the second luminescent material layer and the third luminescent material layer, the first luminescent material layer overlaps with the second luminescent material layer and the third luminescent material layer in an overlapping section.

wherein each of the pixel units further comprises a carrier or exciton blocking layer disposed between the first luminescent material layer and the second luminescent material layer and between the first luminescent material layer and the third luminescent material layer along a direction perpendicular to the base substrate, an orthographic projection of the carrier or exciton blocking layer on the base substrate coincides with an orthographic projection of the overlapping section on the base substrate.

2. The electroluminescent display according to claim 1, wherein each of the luminescent material layers in a same one of the pixel units is made of a different material, and each of the subpixel units in a same one of the pixel units emits light of a different color.

3. The electroluminescent display according to claim 1, wherein each of the subpixel units comprises a first electrode, at least one luminescent material layer, and a second electrode arranged on the base substrate sequentially, and the first electrode comprises a reflective layer arranged on the base substrate and a transparent electrode located over the reflective layer.

4. The electroluminescent display according to claim 3, wherein in a same one of the pixel units, at least one of the subpixel units has a micro cavity length different from that of another one of the subpixel units, the micro cavity length being a length from a side of the reflective layer away from the base substrate to a side of the second electrode away from the base substrate.

5. The electroluminescent display according to claim 4, wherein subpixel units covered by a same luminescent material layer have different micro cavity lengths.

6. The electroluminescent display according to claim 4, wherein in a same one of the pixel units, each of the subpixel units has a different micro cavity length.

7. The electroluminescent display according to claim 6, wherein in a same one of the pixel units, the transparent electrode corresponding to each of the subpixel units has a different thickness.

8. The electroluminescent display according to claim 7, wherein in a same one of the pixel units, each luminescent material layer covers a same number of subpixel units.

9. The electroluminescent display according to claim 1, wherein each of the pixel units is composed of four subpixel units, and
the first luminescent material layer covers a second subpixel unit and a third subpixel unit, the second luminescent material layer covers a first subpixel unit and a second subpixel unit, and the third luminescent material layer covers a third subpixel unit and a fourth subpixel unit, wherein in the second subpixel unit and the third subpixel unit, only the first luminescent material layer emits light.

10. The electroluminescent display according to claim 9, wherein each of the luminescent material layers in a same one of the pixel units is made of a different material, and
each of the subpixel units in a same one of the pixel units emits light of a different color.

11. The electroluminescent display according to claim 9, wherein each of the subpixel units comprises a first electrode, at least one luminescent material layer, and a second electrode arranged on the base substrate sequentially, and
the first electrode comprises a reflective layer arranged on the base substrate and a transparent electrode located over the reflective layer.

12. The electroluminescent display according to claim 11, wherein in a same one of the pixel units, at least one of the subpixel units has a micro cavity length different from that of another one of the subpixel units, the micro cavity length being a length from a side of the reflective layer away from the base substrate to a side of the second electrode away from the base substrate.

13. The electroluminescent display according to claim 12, wherein in a same one of the pixel units, each of the subpixel units has a different micro cavity length.

14. The electroluminescent display according to claim 13, wherein in a same one of the pixel units, the transparent electrode corresponding to each of the subpixel units has a different thickness.

15. The electroluminescent display according to claim 9, wherein both the second luminescent material layer and the third luminescent material layer are located above the first luminescent material layer.

16. A display device, comprising an electroluminescent display, the electroluminescent display comprising a base substrate and a plurality of pixel units arranged in arrays on the base substrate, each of the pixel units being composed of at least four subpixel units, and each of the pixel units comprising at least three luminescent material layers,
wherein each of the luminescent material layers at least covers two adjacent subpixel units,
wherein the at least three luminescent material layers comprises a first luminescent material layer, a second luminescent material layer and a third luminescent material layer, the second luminescent material layer and the third luminescent material layer are arranged in a same layer, the first luminescent material layer is arranged in a different layer from the second luminescent material layer and the third luminescent material layer, the first luminescent material layer overlaps with the second luminescent material layer and the third luminescent material layer in an overlapping section.
wherein each of the pixel units further comprises a carrier or exciton blocking layer disposed between the first luminescent material layer and the second luminescent material layer and between the first luminescent material layer and the third luminescent material layer along a direction perpendicular to the base substrate, an orthographic projection of the carrier or exciton blocking layer on the base substrate coincides with an orthographic projection of the overlapping section on the base substrate.

17. The electroluminescent display according to claim 9, wherein both the second luminescent material layer and the third luminescent material layer are located below the first luminescent material layer.

* * * * *